(12) United States Patent
Araki et al.

(10) Patent No.: US 11,131,720 B2
(45) Date of Patent: Sep. 28, 2021

(54) ELECTRONIC CONTROL DEVICE

(71) Applicant: Mitsubishi Electric Corporation, Tokyo (JP)

(72) Inventors: Rei Araki, Tokyo (JP); Yu Kawano, Tokyo (JP); Norihiro Yamaguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 51 days.

(21) Appl. No.: 16/604,449

(22) PCT Filed: May 11, 2017

(86) PCT No.: PCT/JP2017/017892
§ 371 (c)(1),
(2) Date: Oct. 10, 2019

(87) PCT Pub. No.: WO2018/207319
PCT Pub. Date: Nov. 15, 2018

(65) Prior Publication Data
US 2020/0158788 A1 May 21, 2020

(51) Int. Cl.
*G01R 31/54* (2020.01)
*G01R 31/364* (2019.01)
(Continued)

(52) U.S. Cl.
CPC ............ *G01R 31/54* (2020.01); *B60L 3/0046* (2013.01); *G01R 1/203* (2013.01); *G01R 31/364* (2019.01)

(58) Field of Classification Search
CPC .. G01R 31/54; G01R 31/58; G01R 31/66–70; G01R 31/364; G01R 1/203;
(Continued)

(56) References Cited

U.S. PATENT DOCUMENTS 3,158,806 A * 11/1964 Conrad .................. G01R 31/58
324/511
3,729,653 A * 4/1973 Mankoff .............. H02H 11/001
361/48
(Continued)

FOREIGN PATENT DOCUMENTS

EP 1 143 254 A1 10/2001
JP 4-134080 U 12/1992
(Continued)

OTHER PUBLICATIONS

Extended European Search Report dated Apr. 23, 2020 in European Application No. 17908774.7.
(Continued)

*Primary Examiner* — Patrick Assouad
*Assistant Examiner* — Demetrius R Pretlow
(74) *Attorney, Agent, or Firm* — Sughrue Mion, PLLC; Richard C. Turner

(57) ABSTRACT

Provided is an electronic control device, including: a plurality of grounding terminals provided to a plurality of grounds in the device individually on a one-to-one basis; a grounding common portion for connecting a plurality of grounding points provided to the plurality of grounds individually on a one-to-one basis; a current detection unit configured to detect each of currents flowing between the plurality of grounding points and the plurality of grounding terminals provided for the plurality of grounding points individually on a one-to-one basis or a current flowing through the grounding common portion; and a controller configured to detect a ground open condition for each of the plurality of grounds by comparing a detection result obtained by the current detection unit with a determination value for determining the ground open condition.

15 Claims, 8 Drawing Sheets

(51) Int. Cl.
*B60L 3/00* (2019.01)
*G01R 1/20* (2006.01)

(58) Field of Classification Search
CPC ........ B60L 3/0046; B60L 58/00; B60L 58/10; B60L 58/12–16; B60L 58/18–22; B60L 58/24–27; B60L 58/40
See application file for complete search history.

(56) References Cited

U.S. PATENT DOCUMENTS

| | | | | | |
|---|---|---|---|---|---|
| 4,649,454 | A | * | 3/1987 | Winterton | H02H 5/105 361/42 |
| 5,768,077 | A | * | 6/1998 | Futsuhara | G01R 31/52 361/42 |
| 5,973,410 | A | * | 10/1999 | Roozenbeek | F02D 41/22 307/10.1 |
| 6,278,596 | B1 | * | 8/2001 | Simpson | G01R 1/36 361/101 |
| 6,552,885 | B1 | * | 4/2003 | Campbell | H02H 3/165 361/45 |
| 2005/0180069 | A1 | * | 8/2005 | Tchernobrivets | H02H 3/162 361/46 |
| 2009/0086396 | A1 | * | 4/2009 | Bax | H02H 3/347 361/93.6 |
| 2009/0109588 | A1 | * | 4/2009 | Hayama | G01R 31/58 361/93.1 |
| 2010/0052419 | A1 | * | 3/2010 | Oosawa | G01R 31/52 307/10.1 |
| 2011/0241649 | A1 | | 10/2011 | Ozawa | |
| 2012/0019061 | A1 | | 1/2012 | Nishihara et al. | |
| 2012/0212235 | A1 | * | 8/2012 | Hein | G01R 31/54 324/503 |
| 2015/0346258 | A1 | * | 12/2015 | Haeuslein | G01R 31/54 324/509 |
| 2015/0346264 | A1 | * | 12/2015 | Curtis | G01R 31/50 324/509 |
| 2015/0355260 | A1 | * | 12/2015 | Franchini | G01R 31/2851 324/509 |
| 2016/0261127 | A1 | * | 9/2016 | Worry | H01M 10/425 |
| 2016/0264004 | A1 | * | 9/2016 | Elbhar | B60L 1/00 |
| 2018/0203054 | A1 | * | 7/2018 | Romero | G01R 31/50 |
| 2019/0326742 | A1 | * | 10/2019 | Jyumonji | H02H 1/04 |

FOREIGN PATENT DOCUMENTS

| | | |
|---|---|---|
| JP | 2006-353075 A | 12/2006 |
| JP | 2008-158916 A | 7/2008 |
| JP | 2011-179837 A | 9/2011 |
| WO | 2010113455 A1 | 10/2010 |
| WO | 2014/102954 A1 | 7/2014 |
| WO | 2016143534 A1 | 9/2016 |
| WO | 2017/008057 A1 | 1/2017 |

OTHER PUBLICATIONS

International Search Report for PCT/JP2017/017892 dated Aug. 1, 2017 [PCT/ISA/210].
Communication dated Jul. 28, 2020 from the Japanese Patent Office in Application No. 2019-516824.

* cited by examiner

ELECTRONIC CONTROL DEVICE

CROSS REFERENCE TO RELATED APPLICATIONS

This application is a National Stage of International Application No. PCT/JP2017/017892, filed on May 11, 2017.

TECHNICAL FIELD

The present invention relates to an electronic control device including a configuration capable of detecting a ground open condition.

BACKGROUND ART

Hitherto, there has been proposed a drive control unit in which a drive control system for driving a motor is doubled to be made redundant and connected to a motor having two coil sets (see, for example, Patent Literature 1).

In the above-mentioned drive control unit, power supply from a battery is divided for each drive control system. Each drive control system includes the control circuit including a microcomputer. In the respective drive control systems, the control circuits are connected to each other by a communication line, and have grounds isolated from each other.

Meanwhile, there has been proposed a technology for detecting a ground open condition in such a configuration having a plurality of systems of grounds as described above (see, for example, Patent Literature 2). The related art described in Patent Literature 2 includes a power supply system ground and a signal system ground, and is configured so that those grounds are isolated from each other.

In the above-mentioned configuration, a ground open condition is detected for each ground by an openness detector formed of a comparator. Specifically, one input of the comparator is connected to the ground, and a voltage to be used as a reference is input to the other input. For example, when a break occurs in a ground line, the ground becomes open, and the voltage of ground input is pulled up to an internal power supply voltage by a pull-up resistor. This causes a change in output signal voltage level of the comparator, which allows a ground open condition to be detected as a failure.

CITATION LIST

Patent Literature

[PTL 1] WO 2016/143534 A1
[PTL 2] JP 2008-158916 A

SUMMARY OF INVENTION

Technical Problem

In the related art described in Patent Literature 1, the commonality of a plurality of grounds in a device is not achieved by connecting the grounds to each other, and no description is given of the detection of a ground open condition. In a case where the related art described in Patent Literature 2 is applied to an electronic control device employing a configuration that achieves the commonality of grounds, even when a break occurs between a negative terminal of a battery and a grounding terminal, the voltage of ground input to the comparator is maintained substantially at a ground level, and as a result, it is difficult to detect a ground open condition.

Against this backdrop, there is demand for a technology for detecting a ground open condition in the electronic control device employing the configuration that achieves the commonality of a plurality of grounds in the device by connecting the grounds to each other.

The present invention has been made in order to solve such problems as described above, and has an object to obtain an electronic control device capable of detecting a ground open condition even when employing a configuration that achieves the commonality of a plurality of grounds in the device by connecting the grounds to each other.

Solution to Problem

According to one embodiment of the present invention, there is provided an electronic control device, including: a plurality of grounding terminals provided to a plurality of grounds in the device individually on a one-to-one basis; a grounding common portion for connecting a plurality of grounding points provided to the plurality of grounds individually on a one-to-one basis; a current detection unit configured to detect each of currents flowing between the plurality of grounding points and the plurality of grounding terminals provided for the plurality of grounding points individually on a one-to-one basis or a current flowing through the grounding common portion; and a controller configured to detect a ground open condition for each of the plurality of grounds by comparing a detection result obtained by the current detection unit with a determination value for determining the ground open condition.

Advantageous Effects of Invention

According to the present invention, an electronic control device capable of detecting a ground open condition even when employing a configuration that achieves the commonality of a plurality of grounds in the device by connecting the grounds to each other can be obtained.

DESCRIPTION OF EMBODIMENTS

Now, an electronic control device according to each of exemplary embodiments of the present invention is described with reference to the accompanying drawings. In the illustration of the drawings, the same or corresponding components are denoted by the same reference symbols, and the overlapping description thereof is herein omitted. Moreover, a case in which the present invention is applied to an electronic control device for a vehicle is exemplified in each of the embodiments.

First Embodiment

Figure 1:
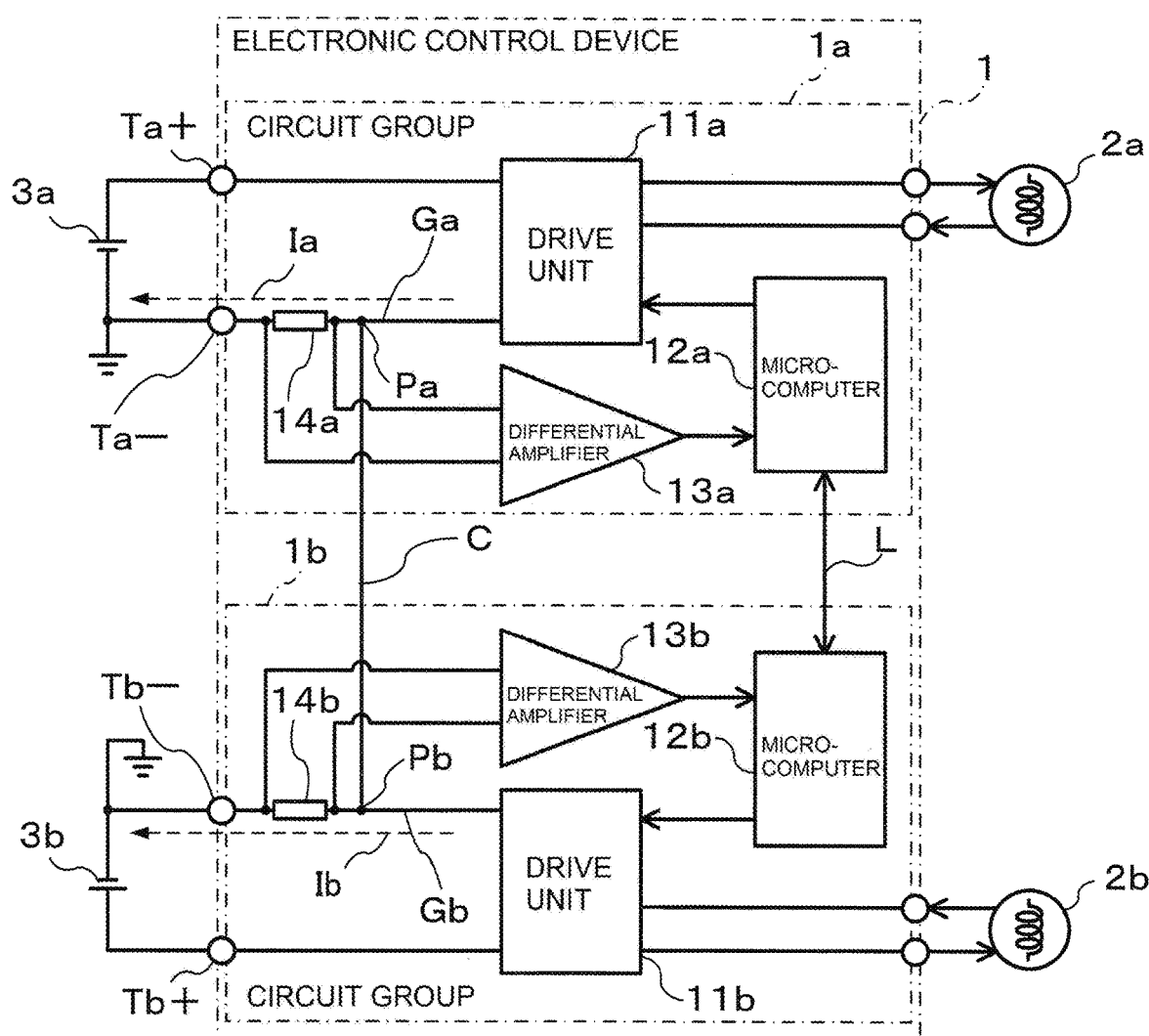
FIG. 1 is a circuit diagram of an electronic control device according to a first embodiment of the present invention.

FIG. 1 is a circuit diagram of an electronic control device 1 according to a first embodiment of the present invention. Connector terminals for power supply of the electronic control device 1 illustrated in FIG. 1 are electrically connected to batteries 3a and 3b being power sources mounted to a vehicle. Specifically, a power supply terminal Ta+ is connected to a positive terminal of the battery 3a, and a grounding terminal Ta− is connected to a negative terminal of the battery 3a. In the same manner, a power supply terminal Tb+ is connected to a positive terminal of the battery 3b, and a grounding terminal Tb− is connected to a negative terminal of the battery 3b.

Here, as a configuration that achieves the commonality of a plurality of grounds Ga and Gb in the device by connecting the grounds Ga and Gb to each other, the electronic control device 1 according to the first embodiment includes: the plurality of grounding terminals Ta− and Tb− provided to the plurality of grounds Ga and Gb in the device individually on a one-to-one basis; and a grounding common portion C for connection between a plurality of grounding points Pa and Pb provided to the plurality of grounds Ga and Gb individually on a one-to-one basis. The grounding common portion C achieves the commonality of the grounds Ga and Gb. Outside the electronic control device 1, the plurality of grounding terminals Ta− and Tb− are individually connected to the negative terminals of the plurality of batteries 3a and 3b, and the commonality of the grounds is achieved at some midpoint of each path involving the connection.

The electronic control device 1 includes a circuit group 1a and a circuit group 1b having the same circuit configuration. The circuit groups 1a and 1b are supplied with electric power from the batteries 3a and 3b, respectively. The circuit groups 1a and 1b are electrically connected to actuators 2a and 2b serving as target devices to be controlled, respectively.

Here, a group of the circuit group 1a, the actuator 2a, and the battery 3a is set as a "first system", and a group of the circuit group 1b, the actuator 2b, and the battery 3b is set as a "second system". The first system operates with the electric power supplied from the battery 3a, and the second system operates with the electric power supplied from the battery 3b.

Each embodiment is described by taking as an example the electronic control device 1 having two systems of the first system and the second system, but the electronic control device 1 may have three or more systems. In each embodiment, "a" is appended to a reference symbol of each of components forming the first system, and "b" is appended to a reference symbol of each of components forming the second system.

The circuit group 1a includes a drive unit 11a, a microcomputer 12a, a differential amplifier 13a, and a resistor 14a. The circuit group 1b includes a drive unit 11b, a microcomputer 12b, a differential amplifier 13b, and a resistor 14b.

The drive units 11a and 11b are electrically connected to the actuators 2a and 2b, respectively. The microcomputers 12a and 12b output control signals to the drive units 11a and 11b electrically connected thereto, respectively. The microcomputers 12a and 12b output the control signals to the drive units 11a and 11b, to thereby operate the actuators 2a and 2b through the intermediation of the drive units 11a and 11b. During the operations of the actuators 2a and 2b, large currents flow to the drive units 11a and 11b.

In this manner, the plurality of circuit groups 1a and 1b are provided for the plurality of grounding terminals Ta− and Tb− individually on a one-to-one basis. The circuit groups 1a and 1b also include the drive units 11a and 11b, which are connected to the microcomputers 12a and 12b and the grounds Ga and Gb, and is configured to drive the actuators 2a and 2b serving as the target devices under control of the microcomputers 12a and 12b, respectively.

The grounds Ga and Gb are grounds of the circuit groups 1a and 1b electrically connected to the grounding terminals Ta− and Tb−. The resistors 14a and 14b serving as current detectors for detecting currents flowing through the grounds Ga and Gb are provided in the vicinities of the grounding terminals Ta− and Tb−, respectively.

The differential amplifiers 13a and 13b output voltages obtained by amplifying potential differences between both ends of the resistors 14a and 14b. The output voltages output from the differential amplifiers 13a and 13b are input to the microcomputers 12a and 12b, respectively. The microcomputers 12a and 12b can acquire ground currents Ia and Ib flowing through the grounding terminals Ta− and Tb− by, for example, measuring the output voltages from the differential amplifiers 13a and 13b by built-in A/D converters.

The ground Ga and the ground Gb are connected to each other by the grounding common portion C. The grounding point Pa between the ground Ga and the grounding common portion C is located on the drive unit 11a side of nodes connecting the differential amplifier 13a and the resistor 14a. In the same manner, the grounding point Pb between the ground Gb and the grounding common portion C is located on the drive unit 11b side of nodes connecting the differential amplifier 13b and the resistor 14b.

In this manner, the plurality of current detectors (namely, plurality of resistors 14a and 14b) provided for the plurality of grounds Ga and Gb individually on a one-to-one basis function as current detection units configured to detect the currents (namely, ground currents Ia and Ib) flowing between the plurality of grounding points Pa and Pb and the plurality of grounding terminals Ta− and Tb− provided for the plurality of grounding points Pa and Pb individually on a one-to-one basis. The plurality of resistors 14a and 14b detect the ground currents Ia and Ib flowing between the corresponding grounding points Pa and Pb and the corresponding grounding terminals Ta− and Tb−, respectively.

As described later, the microcomputers 12a and 12b of the plurality of circuit groups 1a and 1b each function as a controller configured to detect a ground open condition for each of the grounds Ga and Gb by comparing a detection result obtained by the current detection unit with a determination value for determining a ground open condition.

The microcomputers 12a and 12b are connected to each other by a communication line L. For example, the microcomputer 12a and the microcomputer 12b exchange data between the microcomputers 12a and 12b inside the electronic control device 1 in order to mutually monitor a failure and perform a coordinated operation. In this case, when there is a potential difference between the grounds Ga and Gb, the data may possibly fail to be exchanged appropriately to exert influences on, for example, the determination and operations performed by the microcomputers 12a and 12b.

Therefore, in such a configuration, the circuit groups 1a and 1b are expected to have a single ground level.

Figure 2:
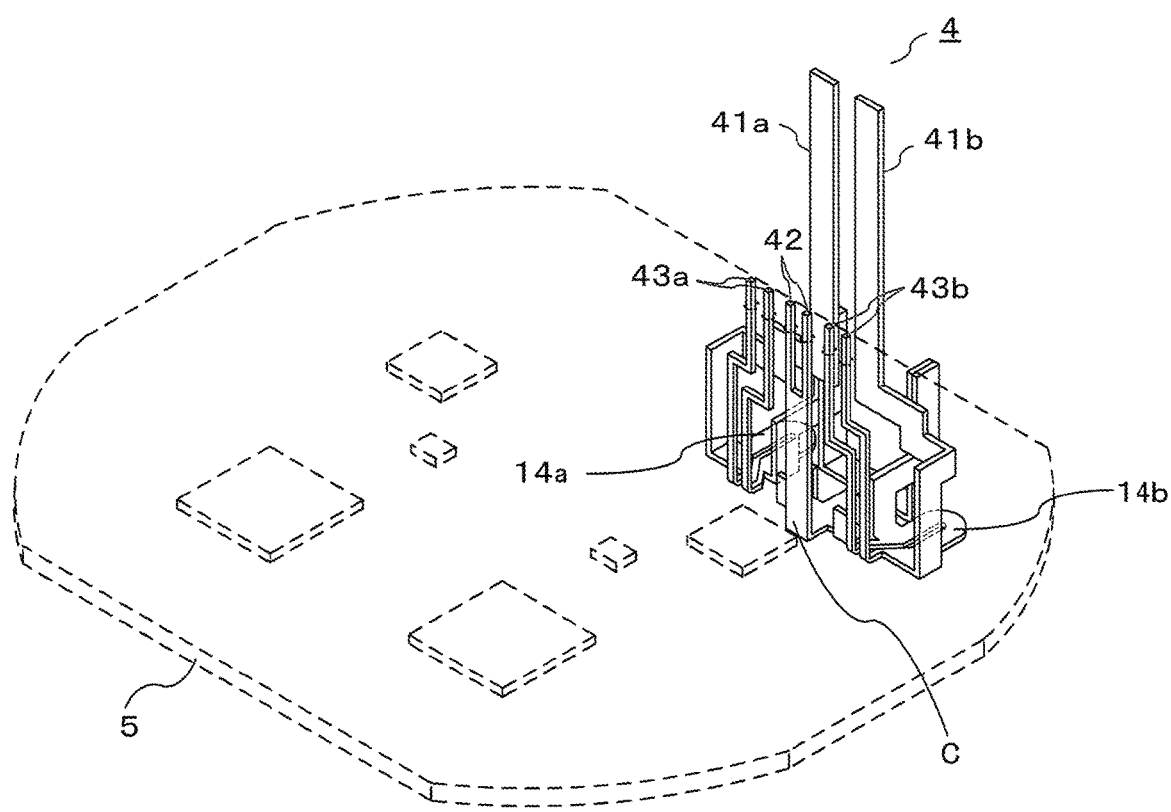
FIG. 2 is a perspective view of a bus bar in the first embodiment of the present invention.
Figure 3:
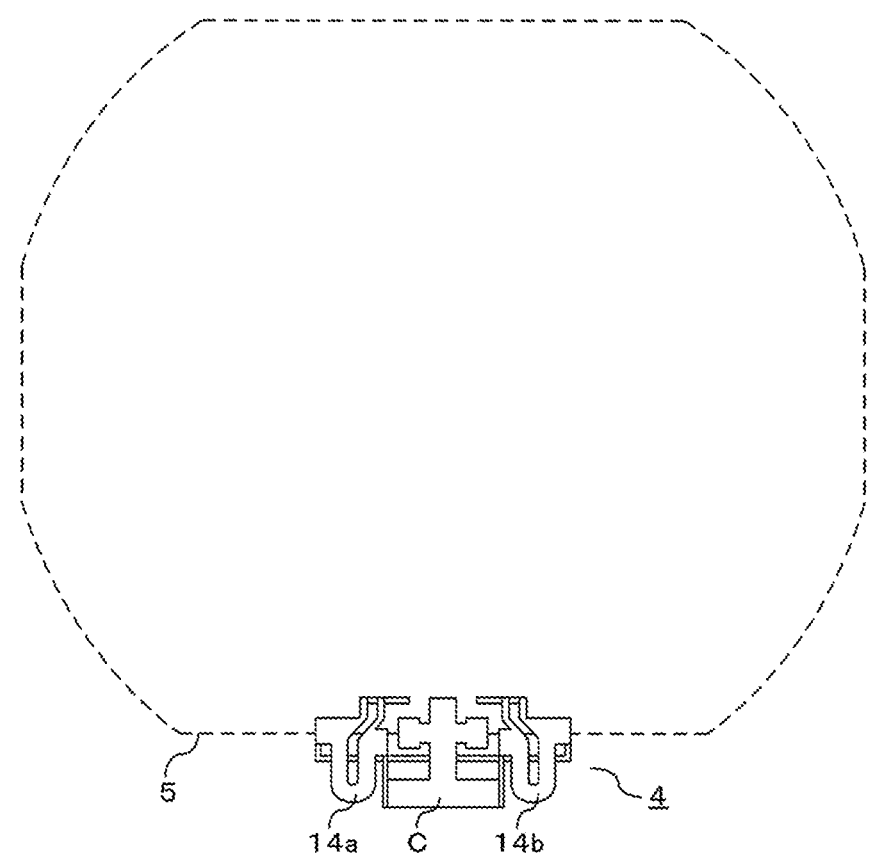
FIG. 3 is a diagram for illustrating a bottom view of FIG. 2.

Now, the resistors 14a and 14b are described with reference to FIG. 2 and FIG. 3. FIG. 2 is a perspective view of a bus bar 4 in the first embodiment of the present invention. FIG. 3 is a bottom view of FIG. 2. FIG. 2 and FIG. 3 are diagrams with a focus on the resistors 14a and 14b each having a U-shape.

As illustrated in FIG. 2 and FIG. 3, the resistors 14a and 14b are formed as parts of the bus bar 4, and each have a U-shape. By setting the shape of each of the resistors 14a and 14b as a U-shape, it is possible to reduce an inductance component in the resistor, and as a result, improve accuracy in detection of a current.

A pair of bus bar terminal portions 43a are caused to extend from both the ends of the resistor 14a in close proximity to each other. By causing the bus bar terminal portions 43a to extend from both the ends of the resistor 14a in close proximity to each other, it is possible to reduce electromagnetic field noise and other such influences from the outside, and as a result, improve the accuracy in detection of a current. The same applies to a pair of bus bar terminal portions 43b, which are caused to extend from both the ends of the resistor 14b.

By thus forming the resistors 14a and 14b as parts of the bus bar 4, for example, a resistor component for the current detector and an assembly process for the resistor component are no longer required, and as a result, the effects of manufacturing cost reduction and downsizing of the electronic control device 1 are produced.

The grounding common portion C is also formed to the bus bar 4, and a pair of bus bar terminal portions 42 are caused to extend from the grounding common portion C.

The bus bar terminal portions 42, 43a, and 43b are electrically connected to a circuit board 5 on which electronic components forming the circuits of the microcomputers 12a and 12b and the differential amplifiers 13a and 13b, which are illustrated in FIG. 1, are packaged. The bus bar terminal portions 43a and 43b are electrically connected to the differential amplifiers 13a and 13b (not shown). Meanwhile, bus bar terminal portions 41a and 41b, which are caused to extend from one of the resistors 14a and 14b to form parts of the bus bar 4, are electrically connected to the grounding terminals Ta– and Tb– (not shown).

In addition, power supply lines (not shown) connecting the drive units 11a and 11b to the power supply terminals Ta+ and Tb+ and the grounding terminals Ta– and Tb–, which are illustrated in FIG. 1, are formed separately from the circuit board 5, and ground lines of the power supply lines are connected to the bus bar 4. With this arrangement, when the actuators 2a and 2b, which are illustrated in FIG. 1, are in operation, the large currents flowing to the drive units 11a and 11b directly flow to the grounding terminals Ta– and Tb– through the bus bar 4 without flowing to the circuit board 5.

As described later with reference to FIG. 4, similarly in a case where a ground becomes open, when the actuators 2a and 2b, which are illustrated in FIG. 1, are operated, the large currents flowing to the drive units 11a and 11b directly flow to the grounding terminals Ta– and Tb– through the grounding common portion C formed to the bus bar 4 without flowing to the circuit board 5. With this arrangement, it is not required to cause a large current to flow to the circuit board 5, and as a result, the effects of manufacturing cost reduction and downsizing of the circuit board 5 are produced.

Referring back to the description with reference to FIG. 1, under normal conditions, that is, when the grounds are not open, in order to cause the ground currents Ia and Ib of the circuit groups 1a and 1b to flow to the grounding terminals Ta– and Tb–, respectively, it is desired to match impedances between the negative terminals of the batteries 3a and 3b and the grounding points Pa and Pb, respectively.

Therefore, in the electronic control device 1, impedances between the grounding terminals Ta– and Tb– and the grounding points Pa and Pb are matched. Between the grounding terminals Ta– and Tb– and the grounding points Pa and Pb, the impedances can be matched by, for example, using the same material, length, width, and thickness of circuit wiring or using the same components.

In this manner, the impedances between the plurality of grounding points Pa and Pb and the plurality of grounding terminals Ta– and Tb– provided for the plurality of grounding points Pa and Pb individually on a one-to-one basis, respectively, are matched with each other.

Here, in the first embodiment, the bus bar 4 is formed between the grounding terminals Ta– and Tb– and the grounding points Pa and Pb as illustrated in FIG. 2 and FIG. 3, and therefore the impedances are matched by, for example, using the same material, length, width, thickness, and shape of the bus bar 4.

To give a description by taking the circuit group 1a as an example, the ground current Ia passes through the resistor 14a and the grounding terminal Ta– to flow to the negative terminal of the battery 3a. The same applies to the circuit group 1b. In this case, the current Ia flows through the resistor 14a, and the current Ib flows through the resistor 14b.

Next, an operation performed by the electronic control device 1 when a ground becomes open is described with reference to FIG. 4. FIG. 4 is a circuit diagram for illustrating a condition in which the grounding terminal Tb– becomes open in the electronic control device 1 illustrated in FIG. 1. In this case, as illustrated in FIG. 4, a case in which the grounding terminal Tb– becomes open is considered as a specific example in which a ground open condition has occurred.

For example, when a break occurs in a wire between the grounding terminal Tb– of the circuit group 1b and the negative terminal of the battery 3b, the circuit group 1b is brought to a ground open condition. In this case, the ground current Ib is inhibited from flowing to the negative terminal of the battery 3b through the grounding terminal Tb–.

However, on the vehicle to which batteries are mounted, the negative terminals of the batteries 3a and 3b are often grounded to the body of the vehicle. In this case, as illustrated in FIG. 4, the ground current Ib passes from the grounding common portion C through the resistor 14a and the grounding terminal Ta–, and then passes from the negative terminal of the battery 3a grounded to the body through the negative terminal of the battery 3b grounded to the body, to thereby flow to the battery 3b.

Therefore, the circuit group 1b continues the operation even after a ground open condition has occurred, which leads to a potential failure condition. In this case, a current flowing through the resistor 14b of the circuit group 1b in which the ground open condition has occurred is zero. Meanwhile, a current flowing through the resistor 14a of the circuit group 1a in which no ground open condition has occurred is Ia+Ib.

In consideration of the above-mentioned points, the electronic control device 1 according to the first embodiment is configured to detect the currents by the resistors 14a and 14*b*, to thereby be able to detect a ground open condition for each of the grounds Ga and Gb. The microcomputers 12*a* and 12*b* of the electronic control device 1 are configured to determine a ground open condition by, for example, the following method.

That is, during the operations of the actuators 2*a* and 2*b*, the microcomputer 12*a* acquires a current value detected by the resistor 14*a*, and when the acquired current value is equal to or smaller than a determination value THa, determines that a ground open condition has occurred in the circuit group 1*a*, namely, the ground Ga. Similarly, during the operations of the actuators 2*a* and 2*b*, the microcomputer 12*b* acquires a current value detected by the resistor 14*b*, and when the acquired current value is equal to or smaller than a determination value THb, determines that a ground open condition has occurred in the circuit group 1*b*, namely, the ground Gb.

Here, a ground current flowing through the resistor of a circuit group in which a ground open condition has occurred is zero, but a difference between the ground current and each of the ground currents Ia and Ib flowing when the actuators 2*a* and 2*b* are not in operation is too small to be detected by the resistors 14*a* and 14*b*.

Meanwhile, when the actuators 2*a* and 2*b* are in operation, large currents flow to the drive units 11*a* and 11*b*, and hence the ground currents Ia and Ib are sufficiently larger than when the actuators 2*a* and 2*b* are not in operation.

From the above, it is desired to determine a ground open condition through use of the current values detected by the resistors 14*a* and 14*b* when the actuators 2*a* and 2*b* are in operation, and with this configuration, it is possible to detect a ground open condition more reliably.

Here, for example, when the actuators 2*a* and 2*b* are not in operation, or when the ground current is extremely small irrespective of the actuators 2*a* and 2*b* that are in operation, it is considered difficult to detect a ground open condition. However, under a condition in which an actuator is hardly in operation, a potential failure condition of the circuit group is not considered as a fatal problem.

Meanwhile, once the actuators 2*a* and 2*b* are operated to start increasing the ground current, it becomes possible to detect a ground open condition, which can avoid a situation in which the actuators 2*a* and 2*b* are operated while the circuit group is in a potential failure condition.

Next, the determination values THa and THb to be used for determining a ground open condition are described. Under normal conditions, that is, when the grounds are not open, the ground currents Ia and Ib flow through the resistors 14*a* and 14*b*, respectively.

The determination value THa is a value set in advance, and is set so as to be smaller than, for example, the ground current Ia flowing when the actuator 2*a* is in operation. The determination value THb is a value set in advance, and is set so as to be smaller than, for example, the ground current Ib flowing when the actuator 2*b* is in operation.

Even when, for example, only the circuit group 1*a* is provided with the resistor 14*a* without providing the circuit group 1*b* with the resistor 14*b* in the electronic control device 1, the microcomputer 12*a* can detect a ground open condition by the following method in the same manner as described above.

In this case, the circuit group 1*a* includes the resistor 14*a*, and hence when, for example, the grounding terminal Ta− becomes open, the microcomputer 12*a* can detect a ground open condition in the above-mentioned manner. That is, the microcomputer 12*a* acquires the current value detected by the resistor 14*a*, and when the acquired current value is equal to or smaller than a determination value TH1, determines that a ground open condition has occurred in the circuit group 1*a*.

Meanwhile, when the grounding terminal Tb− becomes open, the current value detected by the resistor 14*a* is a value obtained by adding the ground current Ib to the ground current Ia. Therefore, the microcomputer 12*a* acquires the current value detected by the resistor 14*a*, and when the acquired current value is equal to or larger than a determination value TH2, determines that a ground open condition has occurred in the circuit group 1*b*.

The determination value TH1 is a value set in advance, and is set so as to be smaller than, for example, the ground current Ia flowing when the actuator 2*a* is in operation. The determination value TH2 is a value set in advance to be larger than the determination value TH1, and is set so as to be smaller than, for example, a sum of the ground current Ia flowing when the actuator 2*a* is in operation and the ground current Ib flowing when the actuator 2*b* is in operation.

To summarize the above description, when a current value I detected by the resistor 14*a* is equal to or smaller than the determination value TH1 (that is, when the relationship of I≤TH1 is satisfied), the microcomputer 12*a* determines that a ground open condition has occurred in the circuit group 1*a*.

In addition, when the current value I detected by the resistor 14*a* is larger than the determination value TH1 and smaller than the determination value TH2 (that is, when the relationship of TH1<I<TH2 is satisfied), the microcomputer 12*a* determines that the circuit group 1*a* and the circuit group 1*b* are under normal conditions.

Moreover, when the current value I detected by the resistor 14*a* is equal to or larger than the determination value TH2 (that is, when the relationship of TH2≤I is satisfied), the microcomputer 12*a* determines that a ground open condition has occurred in the circuit group 1*b*.

In this manner, one current detector (namely, resistor 14*a*) provided for any one of the plurality of grounds Ga and Gb on a one-to-one basis functions as a current detection unit configured to detect any one (namely, ground current Ia) of the currents (namely, ground currents Ia and Ib) flowing between the plurality of grounding points Pa and Pb and the plurality of grounding terminals Ta− and Tb− provided for the plurality of grounding points Pa and Pb individually on a one-to-one basis.

In addition, by providing two threshold values of the determination value TH1 and the determination value TH2, it is possible to detect a ground open condition for each of the circuit groups 1*a* and 1*b* without providing the circuit group 1*b* with the resistor 14*b*. As a result, the effects of manufacturing cost reduction and downsizing of the electronic control device 1 can be expected.

As described above, according to the first embodiment, the electronic control device is configured to cause the current detection units to detect the currents flowing between a plurality of grounding points connected to each other by a grounding common portion and a plurality of grounding terminals provided for the plurality of grounding points individually on a one-to-one basis, and compare the detection results obtained by the current detection units with the determination values for determining a ground open condition, to thereby detect a ground open condition for each ground.

This allows a ground open condition to be detected even when the electronic control device employs the configuration that achieves the commonality of a plurality of grounds in the device by connecting the grounds to each other.

As described above, each circuit group continues the operation even when any one of the grounding terminals becomes open, which leads to a potential failure condition. To cope with this situation, the electronic control device according to the first embodiment can cause, for example, a microcomputer of a circuit group in which a ground open condition has been detected to notify a microcomputer of the other circuit group of a failure condition. In addition, when the electronic control device according to the first embodiment is connected to an external device (for example, another electronic control device or a warning device) so as to enable communication to/from the external device, the electronic control device can cause the microcomputer of the circuit group in which a ground open condition has been detected to notify the external device of a failure condition.

In another case, a current may concentratedly flow to the grounding terminal that is not open, to thereby cause the current to exceed the allowable amount of the grounding terminal. To cope with this situation, the electronic control device according to the first embodiment can suppress the current flowing to the grounding terminal that is not open by, for example, stopping driving the actuator connected to the circuit group in which a ground open condition has been detected.

In this manner, the electronic control device according to the first embodiment is configured to be able to detect a ground open condition that can occur in each circuit group, and therefore contributes to the achievement of the electronic control device having high reliability.

The first embodiment has been described by taking an exemplary case in which the resistors 14a and 14b are configured as parts of the bus bar 4, but the present invention is not limited thereto, and the resistors 14a and 14b may be, for example, shunt resistors.

In the vehicle to which batteries are mounted, the negative terminal of the battery is grounded by the body of the vehicle, the grounding terminals of the electronic control device mounted to the vehicle are often grounded to the body of the vehicle as well. In this case, the grounding terminals Ta− and Tb− of the electronic control device 1 may be grounded to the body together with the ground terminals of another electronic control device. When the grounding of the ground terminals of thee plurality of electronic control devices to the body is removed, the grounding terminals Ta− and Tb− are open to the batteries, but are connected to the grounding terminals of the other electronic control device.

Figure 4:
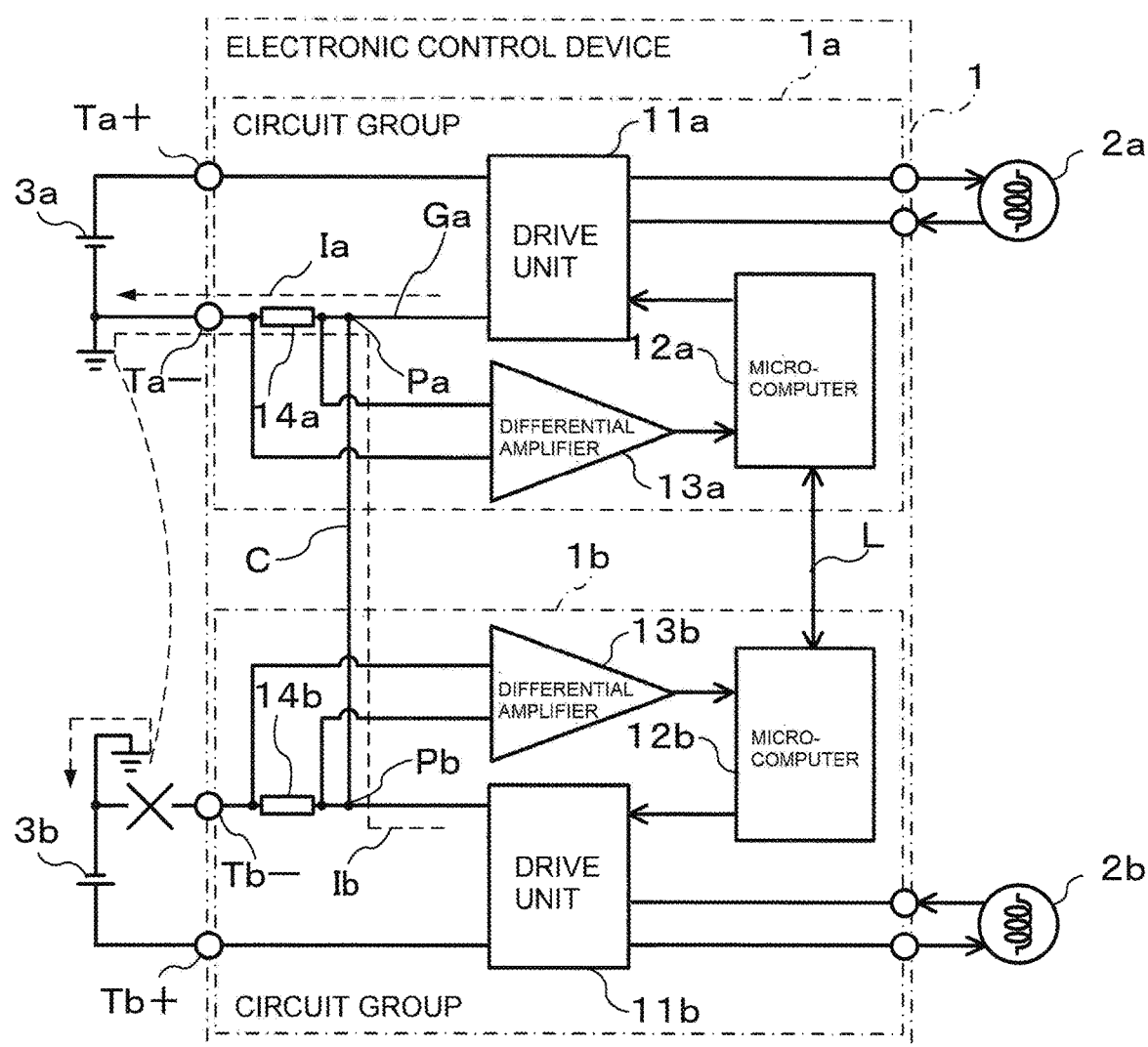
FIG. 4 is a circuit diagram for illustrating a condition in which a grounding terminal Tb− becomes open in the electronic control device illustrated in FIG. 1.

Now, with reference to FIG. 4, a case in which the above-mentioned condition has occurred on the grounding terminal Tb− side is described. A ground current of the other electronic control device flows from the grounding terminal Tb− in the same manner as in FIG. 4, and passes through the grounding common portion C and the grounding terminal Ta− to flow to the battery 3b from the negative terminal of the battery 3a grounded to the body through the negative terminal of the battery 3b grounded to the body.

In this case, a current (that is, negative current value) flowing in a direction reverse to that of a current flowing under normal conditions, that is, when the ground is not open, is detected by the resistor 14b, to thereby be able to detect such a ground open condition that a current flows from another electronic control device to the electronic control device 1 as well. In addition, when the current flowing into the grounding terminal Ta− is large and may exceed the allowable amount of the grounding terminal Ta−, for example, the grounding common portion C is provided with a relay, a fuse, or other such cut-off circuit, to thereby be able to cut off the current flowing into the grounding terminal Ta− as well.

The first embodiment presupposes that a plurality of batteries are provided with the negative terminals of the batteries being grounded to the body of the vehicle, but it is to be understood that the same effects can be produced when, for example, one battery is provided with the negative terminal of the battery being connected to a plurality of grounding terminals.

Second Embodiment

In the first embodiment, as a determination method for a ground open condition, a method of determining a ground open condition by comparing the current values detected by the resistors 14a and 14b during the operations of the actuators 2a and 2b with a determination value set in advance is employed.

However, with the above-mentioned determination method, there is a fear that variations of the current values detected by the resistors 14a and 14b may occur due to, for example, an influence of the temperature, characteristic variations of the components, aging, and other factors. Therefore, when setting the determination value, it is possible to take the variations of the detected current values into consideration.

In view of this, in the second embodiment, the microcomputers 12a and 12b learn the current values detected by the resistors 14a and 14b when the actuators 2a and 2b are not in operation, and values obtained by adding a value set in advance to the learned current values are set as the determination values THa and THb. With this configuration, the determination values THa and THb can easily be obtained irrespective of the variations of the detected current values.

In this manner, the microcomputers 12a and 12b learn the current values detected by the resistors 14a and 14b when the actuators 2a and 2b are not in operation, and change the determination values THa and THb based on the learned current values. The microcomputers 12a and 12b may be configured to learn the current values detected by the resistors 14a and 14b when the actuators 2a and 2b are in operation but the currents flowing through the resistors 14a and 14b are sufficiently small.

As described above, compared to the configuration of the first embodiment, in the second embodiment, there is provided a configuration of learning the currents detected by the current detection units when the target devices are not in operation or when the target devices are in operation but the currents flowing through the current detection units are sufficiently small, and changing the determination values based on the learned current values. With this configuration, it is possible to set the determination values in consideration of the variations of the detected current values, and to achieve improvement of accuracy in determination.

Third Embodiment

In a third embodiment of the present invention, a description is given of the electronic control device 1 including current detectors each having a configuration different from that of the first embodiment. In the third embodiment, a description is omitted for the same points as those of the first embodiment, and is mainly given of points different from the first embodiment.

Figure 5:
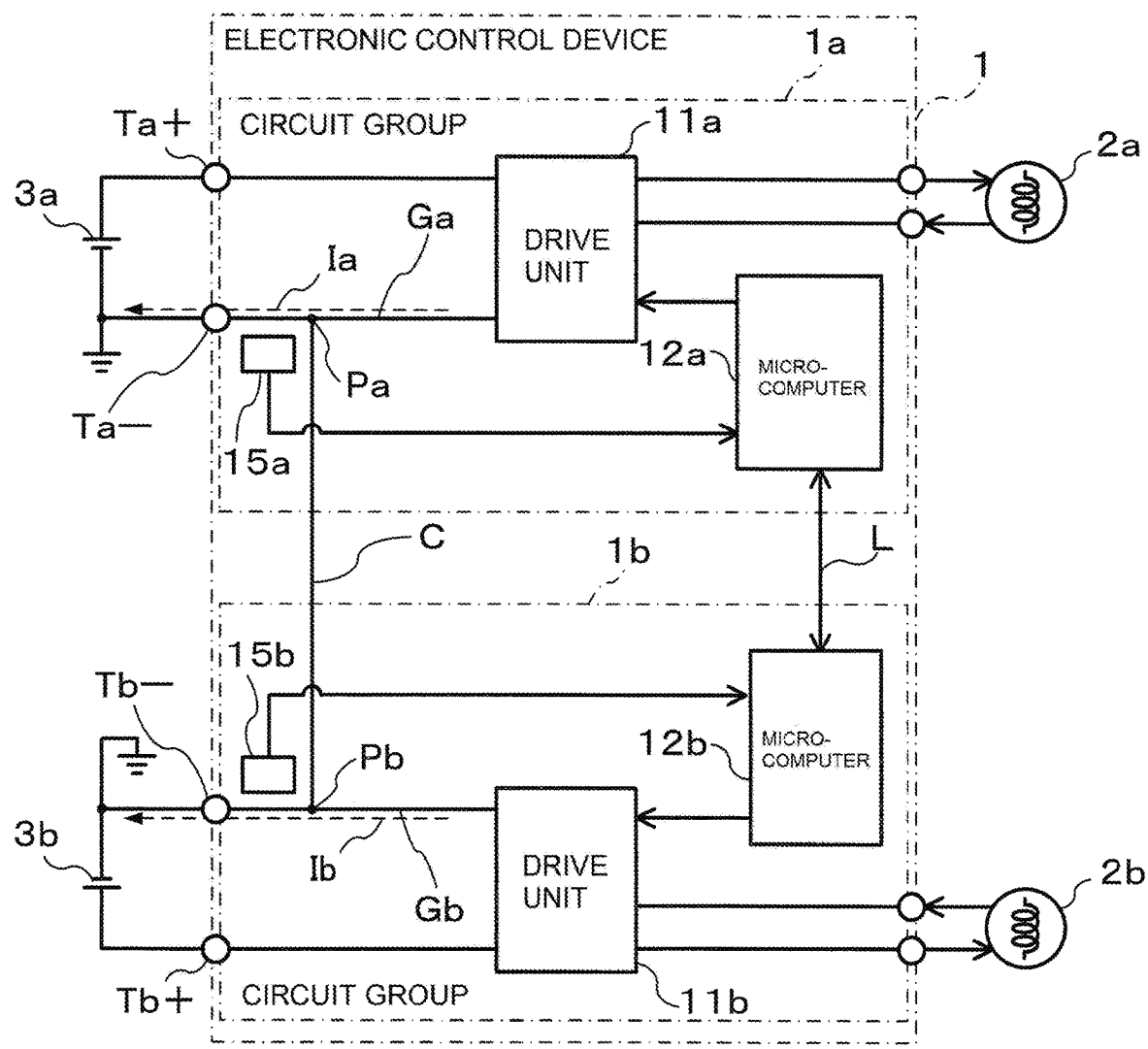
FIG. 5 is a circuit diagram of an electronic control device according to a third embodiment of the present invention.

FIG. 5 is a circuit diagram of the electronic control device 1 according to the third embodiment of the present invention. In the first embodiment, the current detectors for detecting the currents flowing in the grounds Ga and Gb are formed of the resistors 14a and 14b provided to the grounds Ga and Gb, respectively, as illustrated in FIG. 1. In contrast, the current detectors in the third embodiment each have a configuration different from that of the first embodiment.

Specifically, as illustrated in FIG. 5, in place of the resistors 14a and 14b, the circuit groups 1a and 1b include, as the current detectors, Hall current sensors 15a and 15b each configured to detect a current value from a magnetic field generated by the current. The Hall current sensors 15a and 15b serving as the current detectors for detecting the currents flowing through the grounds Ga and Gb are provided in the vicinities of the grounds Ga and Gb and in the vicinities of the grounding terminals Ta– and Tb–, respectively.

Output from the Hall current sensors 15a and 15b is input to the microcomputers 12a and 12b. Similarly to the first embodiment, the microcomputers 12a and 12b can acquire ground currents Ia and Ib flowing through the grounding terminals Ta– and Tb– by, for example, measuring the output voltages from the Hall current sensors 15a and 15b by built-in A/D converters.

Here, in the same manner as in the first embodiment, under normal conditions, that is, when the grounds are not open, a current detected by the Hall current sensor 15a is Ia, and a current detected by the Hall current sensor 15b is Ib.

Figure 6:
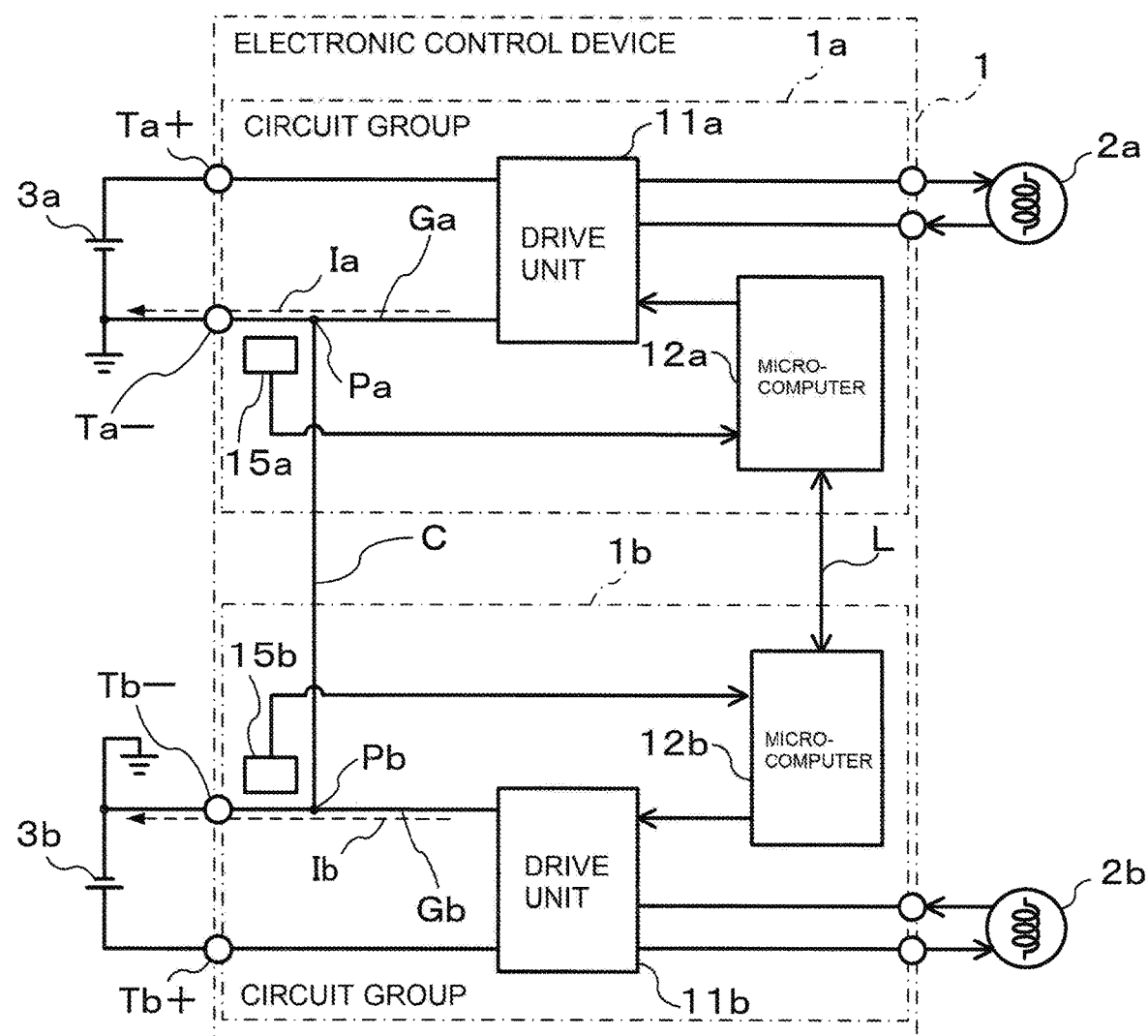
FIG. 6 is a circuit diagram for illustrating a condition in which the grounding terminal Tb− becomes open in the electronic control device illustrated in FIG. 5.

Next, an operation performed by the electronic control device 1 when a ground becomes open is described with reference to FIG. 6. FIG. 6 is a circuit diagram for illustrating a condition in which the grounding terminal Tb– becomes open in the electronic control device 1 illustrated in FIG. 5. In this case, as illustrated in FIG. 6, a case in which the grounding terminal Tb– becomes open is considered as a specific example in which a ground open condition has occurred.

When the grounding terminal Tb– becomes open, in the same manner as in the first embodiment, the current detected by the Hall current sensor 15b becomes zero, and the current detected by the Hall current sensor 15a becomes Ia+Ib. Therefore, it is to be understood that such a characteristic can be used to configure the electronic control device 1 according to the third embodiment to be able to detect a ground open condition as well in the same manner as in the first embodiment.

In this manner, compared to the configuration of the first embodiment, the same effects as those of the first embodiment can be produced even when the Hall current sensors 15a and 15b are used as the current detectors in place of the resistors 14a and 14b.

In the same manner as in the second embodiment, the electronic control device 1 according to the third embodiment can also be configured to learn the current values detected by the Hall current sensors 15a and 15b when the actuators 2a and 2b are not in operation, and set values obtained by adding a value set in advance to the learned current values as the determination values THa and THb.

As described above, according to the third embodiment, compared to the configurations of the first and second embodiments, a Hall current sensor is used as the current detector in place of the resistor. Even with this configuration, the same effects as those of the first and second embodiments can be produced. In the embodiment, the Hall current sensor is provided as an example of the current detector configured to detect a current from the magnetic field generated by the current, but the present invention is not limited thereto. That is, as such a current detector, instead of the Hall current sensor, for example, a giant magneto resistance (GMR), a tunnel magneto resistance (TMR), or other such magneto-resistive current sensor may be used, or another current sensor of a magnetic field detection method may be used.

Fourth Embodiment

In a fourth embodiment of the present invention, a description is given of the electronic control device 1 including current detectors each having a configuration different from those of the first embodiment and the third embodiment. In the fourth embodiment, a description is omitted for the same points as those of the first embodiment, and is mainly given of points different from the first embodiment.

Figure 7:
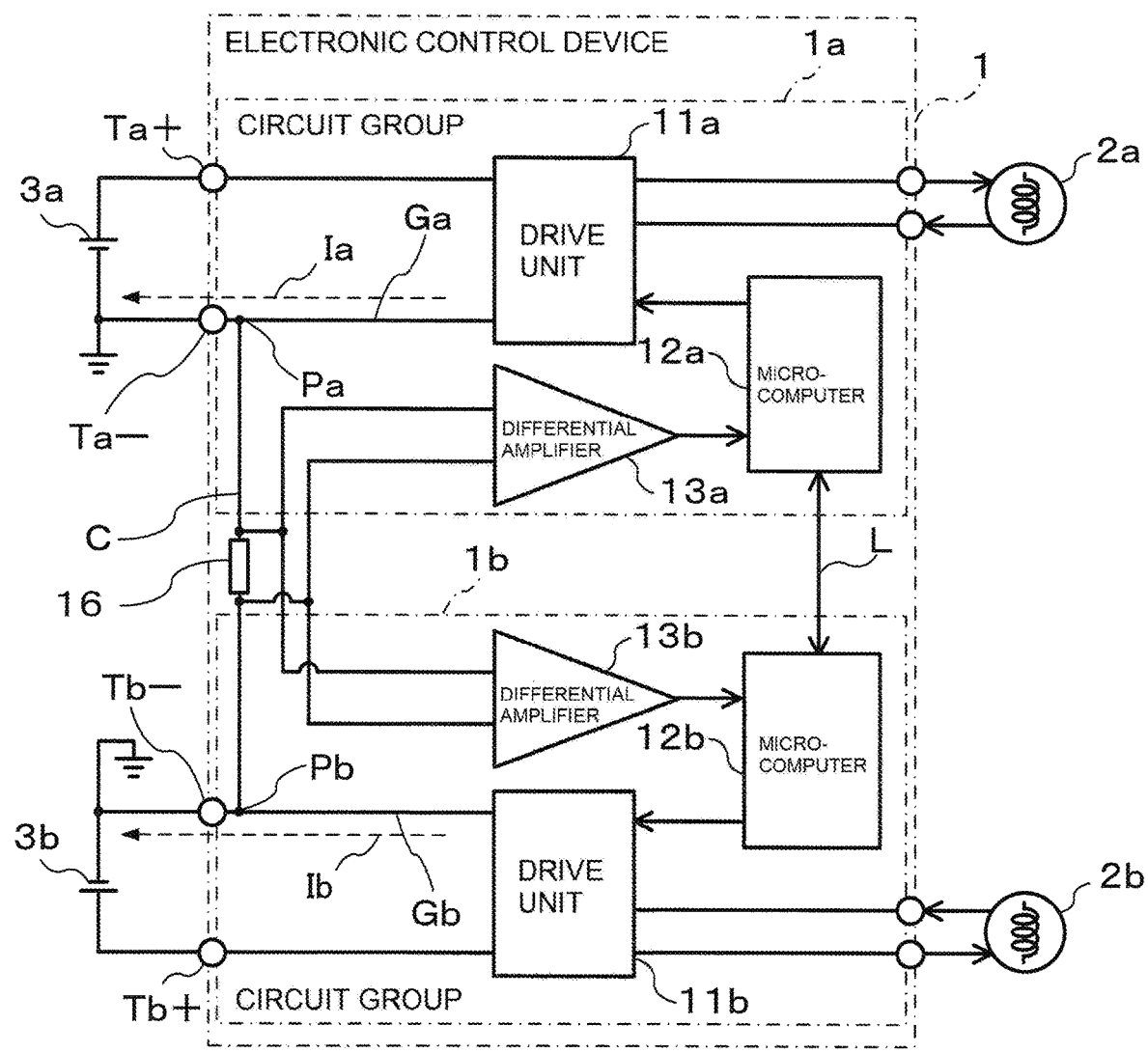
FIG. 7 is a circuit diagram of an electronic control device according to a fourth embodiment of the present invention.

FIG. 7 is a circuit diagram of the electronic control device 1 according to the fourth embodiment of the present invention. In the first embodiment, the current detectors for detecting the currents flowing in the grounds Ga and Gb are formed of the resistors 14a and 14b provided to the grounds Ga and Gb, respectively, as illustrated in FIG. 1. In contrast, the current detectors in the fourth embodiment each have a configuration different from that of the first embodiment. That is, one current detector provided to the grounding common portion C, which is configured to detect the current flowing through the grounding common portion C, functions as a current detection unit configured to detect the current flowing through the grounding common portion C.

Specifically, as illustrated in FIG. 7, the current detector in the fourth embodiment is formed of a resistor 16 provided to the grounding common portion C. Further, the differential amplifiers 13a and 13b are each configured to output a voltage obtained by amplifying a potential difference between both ends of the resistor 16.

Now, a description is given of an exemplary case in which the built-in A/D converters of the microcomputers 12a and 12b have an input voltage range from 0 V to 5 V and measure the output voltages from the differential amplifiers 13a and 13b by the built-in A/D converters.

Firstly, when the potential difference between both the ends of the resistor 16 is zero, that is, when the current flowing through the resistor 16 is zero, the differential amplifiers 13a and 13b each output 2.5 V being a median value of the input voltage range of the A/D converter. The microcomputers 12a and 12b each measure the output value (=2.5 V), to thereby acquire the current value of the current flowing through the resistor 16 as zero.

Secondly, when the current flows through the resistor 16 in a direction from the circuit group 1a side to the circuit group 1b side, the differential amplifiers 13a and 13b each output a voltage larger than 2.5 V. The microcomputers 12a and 12b each measure the output value (>2.5 V), to thereby acquire the current value of the current flowing through the resistor 16 as a positive value.

Thirdly, when the current flows through the resistor 16 in a direction from the circuit group 1b side to the circuit group 1a side, the differential amplifiers 13a and 13b each output a voltage smaller than 2.5 V. The microcomputers 12a and 12b each measure the output value (<2.5 V), to thereby acquire the current value of the current flowing through the resistor 16 as a negative value.

Under normal conditions, that is, when the grounds are not open, in the same manner as in the first embodiment, the ground currents Ia and Ib of the circuit groups 1a and 1b flow to the negative terminals of the batteries 3a and 3b through the grounding terminals Ta– and Tb–, respectively.

In addition, in the same manner as in the first embodiment, impedances between the grounding terminals Ta– and Tb– and the grounding points Pa and Pb are matched with each other, and an impedance between the grounding points Pa and Pb is matched therewith. Therefore, as normal conditions, the potential difference between the grounding points Pa and Pb, that is, the potential difference between both the ends of the resistor 16 is small, and the current flowing through the resistor 16 is also small.

Figure 8:
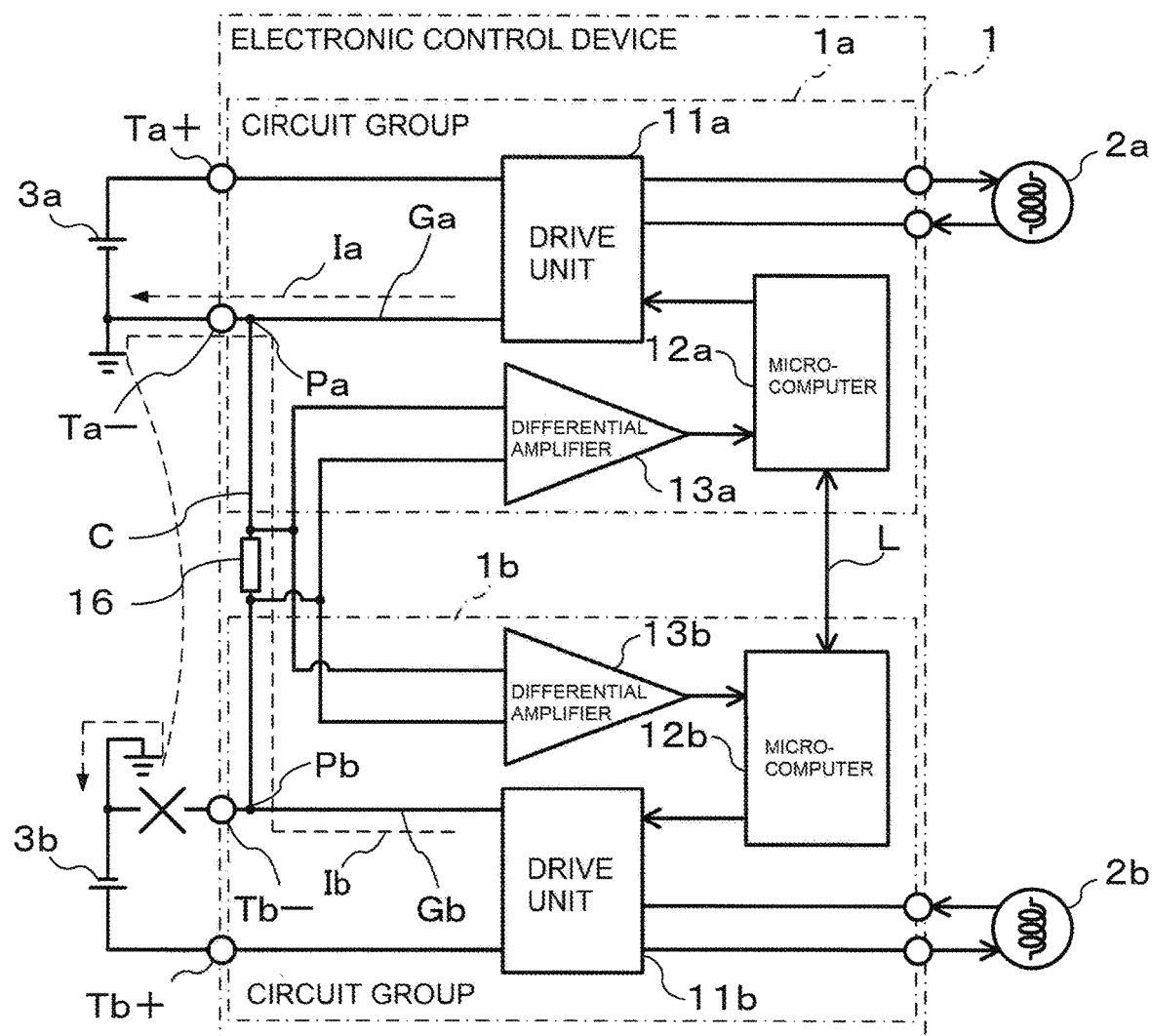
FIG. 8 is a circuit diagram for illustrating a condition in which the grounding terminal Tb− becomes open in the electronic control device illustrated in FIG. 7.

Next, an operation performed by the electronic control device 1 when a ground becomes open is described with reference to FIG. 8. FIG. 8 is a circuit diagram for illustrating a condition in which the grounding terminal Tb– becomes open in the electronic control device 1 illustrated in FIG. 7. In this case, as illustrated in FIG. 8, a case in which the grounding terminal Tb– becomes open is considered as a specific example in which a ground open condition has occurred.

When the grounding terminal Tb– becomes open, the ground currents Ia and Ib flow along the same paths as those of the first embodiment. The ground current Ib flows through the resistor 16 in a direction from the circuit group 1b side to the circuit group 1a side.

In the above-mentioned case, a current value detected by the resistor 16 is –Ib (namely, negative value). When the grounding terminal Ta– becomes open, which is reverse to the example of FIG. 8, the current value detected by the resistor 16 is Ia (namely, positive value). In this manner, the current value becomes positive or negative depending on the direction in which the current flows.

From the above, it is possible to identify the circuit group in which a ground open condition has occurred through use of the current value detected by the resistor 16, that is, the magnitude and direction of the current flowing through the resistor 16.

The microcomputers 12a and 12b of the electronic control device 1 are configured to determine a ground open condition by, for example, the following method. Under normal conditions, that is, when the grounds are not open, the current value detected by the resistor 16 is zero.

In the same manner as in the first embodiment, the microcomputers 12a and 12b acquire the current value detected by the resistor 16 during the operations of the actuators 2a and 2b, and when the acquired current value is equal to or larger than a determination value TH3, determine that a ground open condition has occurred in the circuit group 1a. Similarly, the microcomputers 12a and 12b acquire the current value detected by the resistor 16 during the operations of the actuators 2a and 2b, and when the acquired current value is equal to or smaller than a determination value TH4, determine that a ground open condition has occurred in the circuit group 1b.

The determination value TH3 is a positive value set in advance, and is set so as to be smaller than, for example, the ground current Ia flowing when the actuator 2a is in operation. The determination value TH4 is a negative value set in advance, and is set so that an absolute value of the determination value TH4 is smaller than, for example, the ground current Ib flowing when the actuator 2b is in operation.

In this manner, compared to the configuration of the first embodiment, even when the resistor 16 provided to the grounding common portion C is used as the current detector in place of the resistors 14a and 14b, the same effects as those of the first embodiment can be produced. In addition, compared to the configuration of the first embodiment, the effect of reducing the number of resistors used as the current detectors is produced.

In the same manner as in the first embodiment, the resistor 16 may be formed as a part of the bus bar 4 as illustrated in FIG. 2 and FIG. 3, or may be a shunt resistor. When the resistor 16 is formed as a part of the bus bar 4, the resistor 16 may have a U-shape as illustrated in FIG. 2 and FIG. 3. In another case, in the same manner as in the third embodiment, the Hall current sensor may be used as the current detector in place of the resistor 16.

In the same manner as in the second embodiment, the electronic control device 1 according to the fourth embodiment may also learn the current value detected by the resistor 16 when the actuators 2a and 2b are not in operation, and set the determination value TH3 and the determination value TH4 based on the learned current value (learned value).

In the above-mentioned case, the determination value TH3 is set to a value larger than the learned current value, and the determination value TH4 is set to a value smaller than the learned current value. The learned current value is not always zero, and hence the determination value TH3 and the determination value TH4 may be positive values, negative values, or zero without question, which satisfies the following relational expression.

(determination value $TH3$)>(learned value)>(determination value $TH4$)

In this manner, the microcomputers 12a and 12b learn the current value detected by the resistor 16 when the actuators 2a and 2b are not in operation, and change the determination values TH3 and TH4 based on the learned current value.

As described above, according to the fourth embodiment, the electronic control device is configured to cause the current detection unit to detect the current flowing through the grounding common portion for connecting a plurality of grounding points provided to a plurality of grounds in the device individually on a one-to-one basis, and compare the detection result obtained by the current detection unit with the determination values for determining a ground open condition, to thereby detect a ground open condition for each ground. Even with this configuration, the same effects as those of the above-mentioned first to third embodiments can be produced.

REFERENCE SIGNS LIST 1 electronic control device, 1a, 1b circuit group, 11a, 11b drive unit, 12a, 12b microcomputer, 13a, 13b differential amplifier, 14a, 14b resistor, 15a, 15b Hall current sensor, 16 resistor, 2a, 2b actuator, 3a, 3b battery, 4 bus bar, 41a, 41b bus bar terminal portion, 42 bus bar terminal portion, 43a, 43b bus bar terminal portion, 5 circuit board, Ta+, Tb+ power supply terminal, Ta–, Tb– grounding terminal, Ga, Gb ground, Pa, Pb grounding point, C grounding common portion, L communication line

The invention claimed is:

1. An electronic control device, comprising:
a plurality of grounding terminals provided to a plurality of grounds in the electronic control device individually on a one-to-one basis;
a grounding common portion for connecting a plurality of grounding points provided to the plurality of grounds individually on a one-to-one basis;
a current detector configured to detect each of currents flowing between the plurality of grounding points and the plurality of grounding terminals, respectively, or a current flowing through the grounding common portion; and a controller configured to detect a ground open condition for each of the plurality of grounds by comparing a detection result obtained by the current detector with a determination value for determining the ground open condition, wherein the electronic control device further comprises a plurality of circuit groups provided for the plurality of grounding terminals individually on a one-to-one basis, each of the plurality of circuit groups includes:
  a microcomputer, and
  a driver connected to a corresponding grounding point and configured to drive a target device under control of the microcomputer, and the controller is formed of respective microcomputers of the plurality of circuit groups.

2. The electronic control device according to claim 1, wherein the current detector is formed of a plurality of current detectors provided for the plurality of grounding terminals individually on a one-to-one basis, and the plurality of current detectors are configured to respectively detect the currents flowing between the plurality of grounding points and the plurality of grounding terminals.

3. The electronic control device according to claim 1, wherein the current detector is formed of one current detector provided for any one of the plurality of grounding terminals, and the current detector is configured to detect any one of the currents flowing between the plurality of grounding points and the plurality of grounding terminals.

4. The electronic control device according to claim 1, wherein the current detector is formed of one current detector provided to the grounding common portion, and the current detector is configured to detect the current flowing through the grounding common portion.

5. The electronic control device according to claim 1, wherein the current detector includes a resistor.

6. The electronic control device according to claim 5, wherein the resistor is formed as a part of a bus bar.

7. The electronic control device according to claim 6, wherein the resistor has a U-shape.

8. The electronic control device according to claim 5, wherein the resistor includes a shunt resistor.

9. The electronic control device according to claim 1, wherein the current detector is configured to detect a current from a magnetic field generated by the current.

10. The electronic control device according to claim 1, wherein the plurality of grounding points includes a first grounding point and a second grounding point, the plurality of grounding terminals includes a first grounding terminal and a second grounding terminal, and an impedance between the first grounding terminal and the first grounding point and an impedance between the second grounding terminal and the second grounding point are matched.

11. The electronic control device according to claim 1, wherein the controller is configured to learn a current value detected by the current detector when the target device is not in operation, and change the determination value based on the learned current value.

12. An electronic control device comprising:
a plurality of grounding terminals provided to a plurality of grounds in the electronic control device individually on a one-to-one basis;

a grounding common portion for connecting a plurality of grounding points provided to the plurality of grounds individually on a one-to-one basis;

a current detector configured to detect each of currents flowing between the plurality of grounding points and the plurality of grounding terminals, respectively; and a controller configured to detect a ground open condition for each of the plurality of grounds by comparing a detection result obtained by the current detector with a determination value for determining the ground open condition, wherein the current detector is formed of a plurality of current detectors provided for the plurality of grounding terminals individually on a one-to-one basis, the plurality of current detectors are configured to respectively detect the currents flowing between the plurality of grounding points and the plurality of grounding terminals, and the current detector includes a resistor formed as a part of a bus bar.

13. The electronic control device according to claim 12, wherein the resistor has a U-shape.

14. The electronic control device according to claim 12, wherein the resistor includes a shunt resistor.

15. The electronic control device according to claim 12, further comprising a plurality of circuit groups provided for the plurality of grounding terminals individually on a one-to-one basis, each of the plurality of circuit groups includes:
  a microcomputer, and
  a driver connected to a corresponding grounding point and configured to drive a target device under control of the microcomputer, and the controller is formed of respective microcomputers of the plurality of circuit groups.

* * * * *